United States Patent [19]
Miyoshi

[11] Patent Number: 5,835,937
[45] Date of Patent: Nov. 10, 1998

[54] MICROCOMPUTER WITH AN IMPROVED DRAM-CONTROLLER RESPONSIBLE FOR A CBR SELF-REFRESH OPERATION

[75] Inventor: Nobuaki Miyoshi, Tokyo, Japan

[73] Assignee: NEC Corporation, Tokyo, Japan

[21] Appl. No.: 665,730

[22] Filed: Jun. 17, 1996

[30] Foreign Application Priority Data

Jun. 16, 1995 [JP] Japan ..................... 7-174026

[51] Int. Cl.⁶ .................................................. G06F 12/16
[52] U.S. Cl. ............................................ 711/106; 365/222
[58] Field of Search ........................... 711/106; 365/222

[56] References Cited

U.S. PATENT DOCUMENTS 5,634,106  5/1997  Yaezawa .................................. 711/106

Primary Examiner—Eddie P. Chan
Assistant Examiner—Hiep T. Nguyen
Attorney, Agent, or Firm—Young & Thompson

[57] ABSTRACT

A microcomputer includes a CPU and a DRAM controller which is electrically connected to the CPU. The DRAM controller is also electrically connected to a DRAM for controlling the DRAM to execute dispersion CBR refresh operations in the normal mode. When the microcomputer is in a stand-by state, the DRAM controller so controls CAS and RAS control terminals of the DRAM as to have the DRAM enter into a CBR self-refresh mode. When the microcomputer receives an external bus hold demand during the stand-by state, the DRAM controller places the CAS and RAS control terminals of the DRAM into a high impedance state. When an external bus hold is released, the DRAM controller places the CAS and RAS control terminals of the DRAM into an inactive level to release at once the DRAM from the self-refresh mode and then place the DRAM into the self-refresh mode again.

12 Claims, 4 Drawing Sheets

MICROCOMPUTER WITH AN IMPROVED DRAM-CONTROLLER RESPONSIBLE FOR A CBR SELF-REFRESH OPERATION

BACKGROUND OF THE INVENTION

The present invention relates to a microcomputer, and more particularly to a microcomputer with an improved DRAM-controller responsible for a CBR self-refresh operation during a stand-by state of the microcomputer.

Dynamic random access memories (DRAM) are designed to have memory cells, each of which has a memory cell capacitor for storing information such as data by electrically charging the memory cell capacitor. Actually, however, it is difficult to keep for a long time or permanently the information once stored in the memory cells in the dynamic random access memory since it is physically unavoidable to present spontaneous leakage of the charge in the memory. In order to keep the information for a required long time, it is required to conduct frequently refresh operations by recharging the memory cell at a short time interval within critical time intervals set for individual dynamic random access memories. If the time interval for conducting the refresh operations by recharging the memory cell is longer than the critical time interval, there is a possibility of loss of the information by a certain leakage of the charge from the memory cell.

There is a CAS-before-RAS-refresh (CBR-refresh) in various refresh types. The CBR-refresh is made sequentially by word unit by use of a refresh counter accommodated in the dynamic random access memory. The CBR-refresh uses two terminals, for example, column address strobes (CAS) and row address strobes (RAS). The column address strobes are activated before the row address strobes are activated for subsequent refresh operation for one word. Thereafter, the column address strobes and the row address strobes are inactivated. The above processes are repeated for every word unit.

If the column address strobes and the row address strobes remain active for a time longer than a critical time set uniquely for the dynamic random access memory, then the refresh counter conducts an automatic increment after the critical time passes, whereby the refresh operations as described above are automatically continued. This process is referred to as CBR self-refresh. When the refresh operations are performed in this CBR self-refresh mode, it is easier to reduce power consumption than in the normal CBR refresh mode. If the DRAM is provided with a CBR self-refresh function, then the DRAM is allowed to execute an automatic refresh with reference to internal addresses under control of an internal clock.

As described above, the first refreshing method is that the CAS and then the RAS are in turn activated for one time refresh operation and thereafter the CAS and then the RAS are inactivated. Those processes are repeated for every word.

The second refreshing method is that the CAS and then the RAS are in turn activated for a long time so that the automatic and sequential CBR self-refresh operation will be commenced.

The above first refreshing method is classified into two methods. One is the dispersion CBR refresh and the other is the concentration refresh. In the dispersion CBR refresh, the above refresh operations are discontinuously made at a predetermined time interval, whilst in the concentration CBR refresh, the above refresh operations are continuously made without any time interval.

The condition for entering the CBR self-refresh mode described above as the second refresh method is different between when the dispersion CBR refresh is normally made and when the concentration CBR refresh is normally made. Namely, when the concentration CBR refresh is normally made, it is required to conduct one time the concentration CBR refresh before and after the CBR self-refresh. When the dispersion CBR refresh is normally made, there is no particular condition for entering into the CBR self-refresh mode.

By the way, in order to reduce the power consumption, it is known to place the microcomputer in the stand-by state so that an external device can use the DRAM. However, if the microcomputer enters into the stand-by state, the DRAM controller in the microcomputer also enters into the stand-by state, for which reason it is impossible to conduct the refresh operation under the control of the DRAM controller.

In order to settle the above problem, in case that the DRAM is designed to conduct the dispersion refresh operation, the CAS and RAS are activated during the stand-by state of the microcomputer so that it is possible to set the CBR self-refresh mode.

When the microcomputer receives an external bus hold demand, the microcomputer places terminals connected to the DRAM in to high impedance states so as to send access right to an external access device whereby the external access device can control the DRAM.

After the processing by the external access device is completed, the access right is then returned to the microcomputer so that the microcomputer can again control the DRAM. At this time, the CAS and RAS terminals are changed from the impedance state to the active level as illustrated in FIG. 1 wherein the active level corresponds to the low level so that the DRAM controller can place the DRAM into the CBR self-refresh mode.

In the above conventional method, however, it is required to provide an external circuit operable for allowing the external access device to place the DRAM into the CBR self-refresh mode. It is also required that the CBR self-refresh is made after the microcomputer is released from the stand-by state.

In the Japanese laid-open patent application No. 62-172593, it is disclosed that when the microcomputer having a DRAM refresh function is placed into the stand-by state in accordance with the demand or instruction such as HALT, a level of the refresh control output signal is set at a low level so that even if the right to use the external bus is assigned to an other controller, I/O and memory devices, the refresh output is kept in low level or active level to thereby allow the CBR-self refresh of the DRAM. It is however required to provide an external circuit for having the DRAM enter into the CBR-self refresh mode after the external bus hold was released.

As described above, when the conventional microcomputer is in the stand-by mode, then the DRAM is set in the CBR-self refresh mode. Thereafter, when the external bus hold demand is generated then the control terminals are made into the high impedance state to assign the access and control right of the DRAM to the external access device. The processing by the external access device was completed and the CAS and RAS terminals remain in the inactive level or the high impedance state. When, in this state, the right to control the DRAM is returned to the microcomputer, the CAS and RAS terminals are concurrently changed to the active level as illustrated in FIG. 1. This concurrent change into the active level of the CAS and RAS terminals makes it difficult to have the DRAM enter into the CBR-self refresh mode. This means that it is impossible to conduct the refresh for a time longer than the critical time interval whereby the information once stored in the memory cell is likely to be lost.

If the concentration CBR refresh method is adopted, namely the normal refresh operation is the concentration CBR refresh mode, then the following operations are necessary. After the external access device completed the necessary works, the microcomputer is released from the stand-by state and then the microcomputer executes a certain software subroutine to send the DRAM controller an instruction to execute the concentration CBR refresh. Those sequential processes are required for every time when the external access device accesses to the DRAM. Namely, the release of the stand-by state of the microcomputer is necessary every time when the external access device accesses the DRAM. This results in disadvantageous increases in power consumption and necessary time as well as software capacity of the microcomputer.

SUMMARY OF THE INVENTION

Accordingly, it is an object of the present invention to provide a novel microcomputer having a DRAM controller free from any disadvantages as described above.

It is a further object of the present invention to provide a novel microcomputer having a DRAM controller adopting a dispersion CBR refresh in a normal mode and further being capable of controlling a DRAM to execute a CBR self-refresh of the DRAM even when an external bus hold demand is generated under a condition that the microcomputer is in a stand-by state.

It is a still further object of the present invention to provide a novel microcomputer having a DRAM controller adopting a concentration CBR refresh in a normal mode and further being capable of controlling a DRAM to execute a CBR self-refresh of the DRAM even when an external bus hold demand is generated under a condition that the microcomputer is in a stand-by state.

It is a furthermore object of the present invention to provide a novel microcomputer having a DRAM controller being capable of controlling a series of refresh operations without relying upon any software to be free from need to release the microcomputer from the stand-by state.

It is a moreover object of the present invention to provide a novel microcomputer having a DRAM controller being capable of controlling a series of refresh operations at a reduced power.

It is a still more object of the present invention to provide a novel microcomputer having a DRAM controller being capable of controlling a series of refresh operations with deed a reduced memory capacity necessary for executing a CBR self-refresh of the DRAM.

The above and other objects, features and advantages of the present invention will be apparent from the following descriptions.

In accordance with the first embodiment of the present invention, a novel microcomputer includes a CPU and a DRAM controller which is electrically connected to the CPU. The DRAM controller is also electrically connected to a DRAM for controlling the DRAM to execute dispersion CBR refresh operations in the normal mode. When the microcomputer is in a stand-by state, the DRAM controller so controls CAS and RAS control terminals of the DRAM as to have the DRAM enter into a CBR self-refresh mode. When the microcomputer receives an external bus hold demand during the stand-by state, the DRAM controller places the CAS and RAS control terminals of the DRAM into a high impedance state. When an external bus hold is released, the DRAM controller places the CAS and RAS control terminals of the DRAM into an inactive level to release at once the DRAM from the self-refresh mode and then place the DRAM into the self-refresh mode again.

In accordance with the second present invention, a novel microcomputer includes a CPU and a DRAM controller which is electrically connected to the CPU. The DRAM controller is also electrically connected to a DRAM for controlling the DRAM to execute concentration CBR refresh operations in the normal mode. When the microcomputer is in a stand-by state, the DRAM controller so controls CAS and RAS control terminals of the DRAM as to have the DRAM enter into a CBR self-refresh mode. When the microcomputer receives an external bus hold demand during the stand-by state, the DRAM controller places the CAS and RAS control terminals of the DRAM into a high impedance state. When an external bus hold is released, the DRAM controller places the CAS and RAS control terminals of the DRAM into an inactive level to release at once the DRAM from the self-refresh mode and then execute a concentration CBR refresh of the DRAM before the DRAM controller places the DRAM into the self-refresh mode again.

BRIEF DESCRIPTIONS OF THE DRAWINGS

Preferred embodiments of the present invention will be described in detail with reference to the accompanying drawings.

DISCLOSURE OF THE INVENTION

Figure 1:
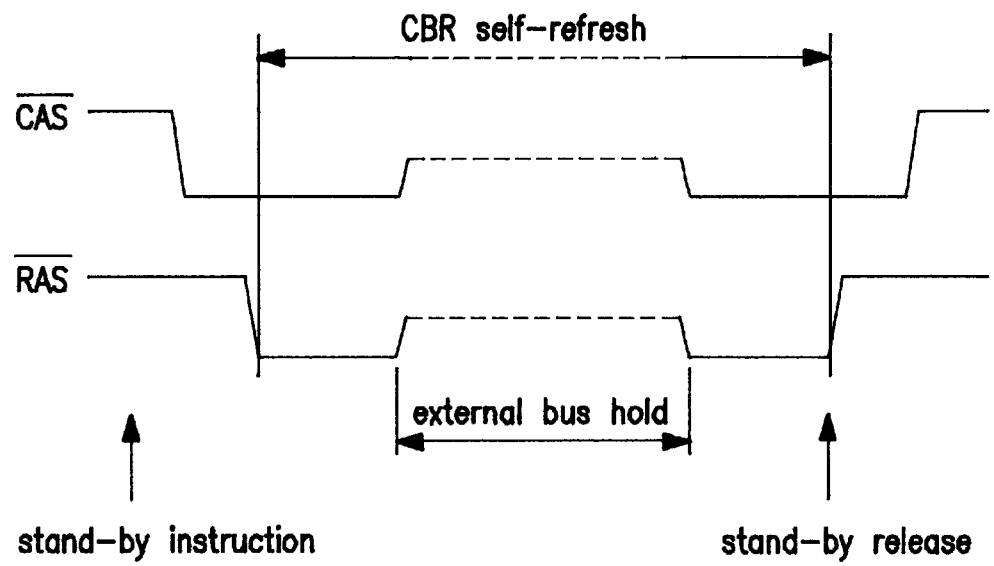
FIG. 1 is a timing chart illustrative of variations in voltage of CAS terminals and RAS terminals in the conventional CBR-self refresh operations.

The present invention provides a microcomputer comprising a CPU, and a DRAM controller being electrically connected to the CPU and also electrically connected to a DRAM for controlling the DRAM to execute dispersion CBR refresh operations in a normal mode. If the microcomputer is in a stand-by state, then the DRAM controller so controls CAS and RAS control terminals of the DRAM as to have the DRAM enter into a CBR self-refresh mode. Thereafter if the microcomputer receives an external bus hold demand during the stand-by state, then the DRAM controller places the CAS and RAS control terminals of the DRAM into a high impedance state so that if an external bus hold is released, then the DRAM controller places the CAS and RAS control terminals of the DRAM into an inactive level to release at once the DRAM from the self-refresh mode and subsequently place the DRAM into the self-refresh mode again.

The DRAM controller comprises a dispersion CBR refresh controller for controlling a CBR refresh operation, a CBR self-refresh controller for controlling a CBR self-refresh operation, a CBR self-refresh controller for receiving an external bus hold demand, and a selector having a CAS selector and a RAS selector, where the CAS selector is electrically connected to the CAS terminal of the DRAM and also electrically connected to the dispersion CBR refresh controller as well as electrically connected via the CBR self-refresh stand-by controller to the CBR self-refresh controller whilst the RAS selector is electrically connected to the RAS terminal of the DRAM and also electrically connected to the dispersion CBR refresh controller as well as electrically connected via the CBR self-refresh stand-by controller to the CBR self-refresh controller. The selector is further connected to the CBR self-refresh stand-by controller for receiving the external bus hold demand.

If the microcomputer receives the external bus hold demand under the conditions that the microcomputer is placed in the stand-by state and that the DRAM is in the CBR self-refresh mode, then at the time when the external bus hold is released, the selector selects the CBR self-refresh controller and then the CBR stand-by mode refresh controller controls the CAS terminal and the RAS terminal to release at once the DRAM from the CBR self-refresh mode before placing the DRAM into the CBR self-refresh mode again.

The present invention also provides another microcomputer comprising a CPU and a DRAM controller being electrically connected to the CPU, the DRAM controller being also electrically connected to a DRAM for controlling the DRAM to execute concentration CBR refresh operation in a normal mode. If the microcomputer is in a stand-by state, then the DRAM controller so controls CAS and RAS control terminals of the DRAM as to have the DRAM enter into a CBR self-refresh mode. Thereafter if the microcomputer receives an external bus hold demand during the stand-by state, then the DRAM controller places the CAS and RAS control terminals into a high impedance state so that if an external bus hold is released, then the DRAM controller places the CAS and RAS control terminals into an inactive level to release at once the DRAM from the self-refresh mode and then execute a concentration CBR refresh of the DRAM before the DRAM controller places the DRAM into the self-refresh mode again.

The DRAM controller comprises a dispersion CBR refresh controller for controlling a CBR refresh operation, a CBR self-refresh controller for controlling a CBR self-refresh operation, a CBR self-refresh stand-by controller being electrically connected to the CBR self-refresh controller for receiving an external bus hold demand, a selector having a CAS selector and a RAS selector, where the CAS selector being electrically connected to the CAS terminal and also electrically connected to the dispersion CBR refresh controller as well as electrically connected via the CBR self-refresh stand-by controller to the CBR self-refresh controller whilst the RAS selector is electrically connected to the RAS terminal and also electrically connected to the dispersion CBR refresh controller as well as electrically connected via the CBR self-refresh stand-by controller to the CBR self-refresh controller, the selector being further connected to the CBR self-refresh stand-by controller for receiving the external bus hold demand, and a concentration CBR refresh controller provided between the dispersion CBR refresh controller and the CBR self-refresh stand-by controller.

If the microcomputer receives the external bus hold demand under the conditions that the microcomputer is placed in the stand-by state and that the DRAM is in the CBR self-refresh mode, then at the time when the external bus hold is released, the selector in the DRAM controller selects the CBR self-refresh stand-by controller so that the CBR stand-by mode refresh controller sends the selector an instruction to select the CBR self-refresh stand-by controller whereby the CBR self-refresh stand-by controller controls the CAS terminal and the RAS terminal to release at once the DRAM from the CBR self-refresh mode and subsequently send the selector an instruction to select the dispersion CBR refresh controller as well as send the dispersion CBR refresh controller an instruction to execute the concentration CBR refresh so as to have the DRAM enter into the concentration CBR self-refresh mode before the selector selects an output from the CBR self-refresh controller to render the DRAM enter into the CBR self-refresh mode again.

As described above, even if the microcomputer receives an external bus hold demand under the conditions that the microcomputer is placed in the stand-by state and that the DRAM is in the CBR self-refresh mode, then at the time when the external bus hold is released, the DRAM controller at once releases the DRAM from the CBR self-refresh mode before placing the DRAM into the CBR self-refresh mode again for executing the CBR self-refresh of the DRAM to keep information stored in the DRAM.

The above operations do not need to release the microcomputer from the stand-by state because there is no need to use any software for executing the above processes. This results in a reduction in the power consumption of the microcomputer. There is also no need to reduce a capacity of the memory for storing the necessary software. Further, there is no need to provide an external circuit for executing the CBR self-refresh of the DRAM. This results in a scaling down of the total system including the microcomputer and a reduction in the manufacturing cost of the total system.

EMBODIMENTS

Figure 2:
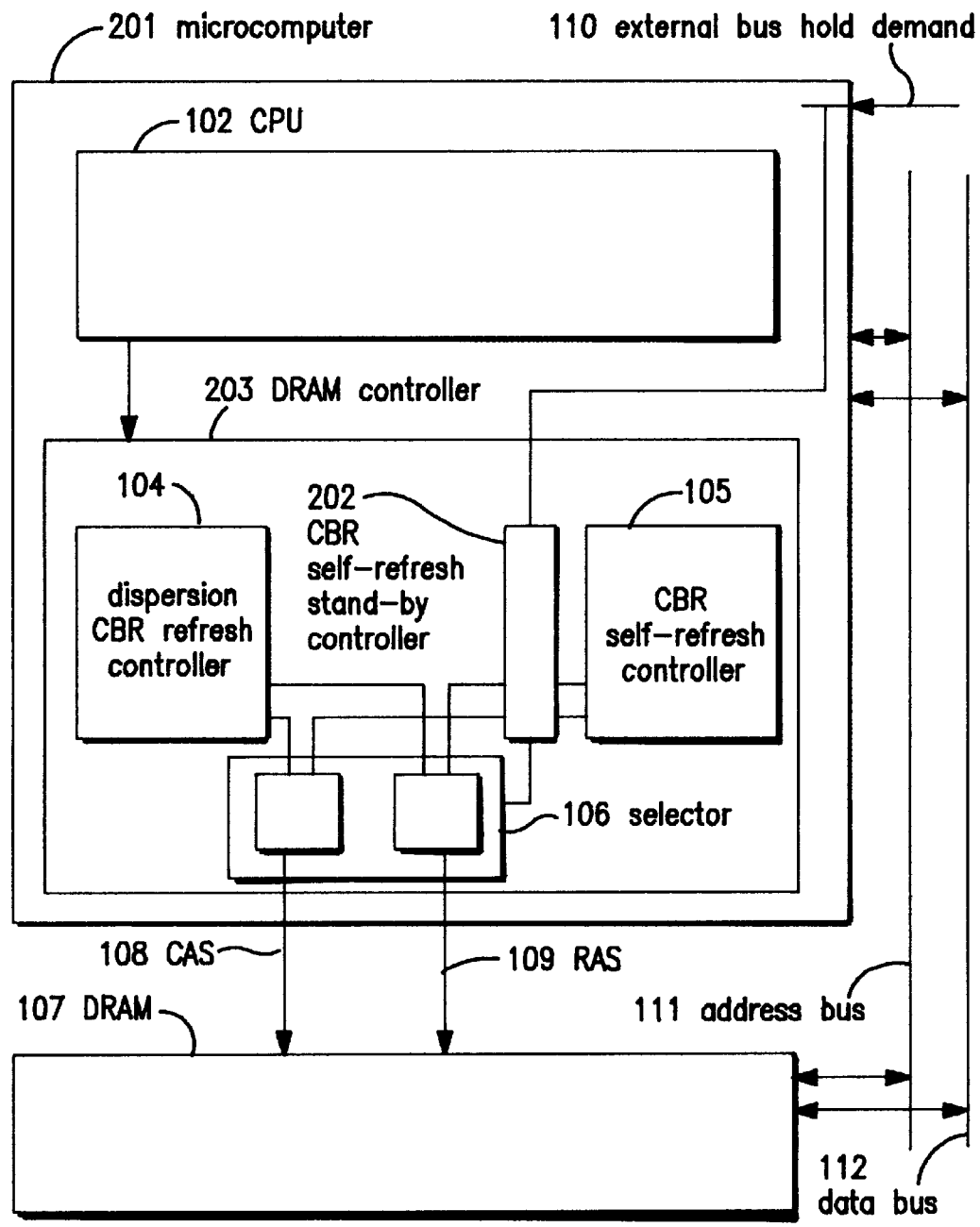
FIG. 2 is a diagram illustrative of a structure of a novel microcomputer accommodating an improved DRAM controller wherein a dispersion CBR refresh is adopted in a first embodiment according to the present invention.

A first embodiment according to the present invention will be described in detail with reference to FIGS. 2 and 4, wherein there is provided a novel microcomputer having a DRAM controller adopting a dispersion CBR refresh in a normal mode and further being capable of controlling a DRAM to execute a CBR self-refresh of the DRAM even when an external bus hold demand is generated under a condition that the microcomputer is in a stand-by state.

A microcomputer 201 in the first embodiment according to the present invention includes a CPU 102 and a DRAM controller 203 being electrically connected via a CAS terminal 108 and a RAS terminal 109 to a DRAM 107. The microcomputer 201 is also connected via an address bus 111 and a data bus 112 to the DRAM 107. The DRAM controller 203 is also electrically connected to the CPU 102 for receiving any instruction from the CPU 102.

The DRAM controller 203 includes a dispersion CBR refresh controller 104 for controlling a CBR refresh operation and a CBR self-refresh controller 105 for controlling a CBR self-refresh operation. The DRAM controller 203 further includes a CBR self-refresh stand-by controller 202 which is electrically connected to the CBR self-refresh controller 105 for receiving an external bus hold demand 110. The DRAM controller 203 furthermore includes a selector 106 having a CAS selector and a RAS selector. The CAS selector is electrically connected to the CAS terminal 108 of the DRAM 107. The CAS selector is also electrically connected to the dispersion CBR refresh controller 104. Further, the CAS selector is also electrically connected via the CBR self-refresh stand-by controller 202 to the CBR self-refresh controller 105. The RAS selector is electrically connected to the RAS terminal 109 of the DRAM 107. The RAS selector is also electrically connected to the dispersion CBR refresh controller 104. Further, the RAS selector is also electrically connected via the CBR self-refresh stand-by controller 202 to the CBR self-refresh controller 105. The selector is further connected to the CBR self-refresh stand-by controller 202 for receiving the external bus hold demand 110.

The microcomputer 201 uses the dispersion CBR refresh method and thus the DRAM controller subjects the DRAM to the dispersion CBR refresh in the normal refresh mode. The dispersion CBR refresh controller 104 outputs dispersion CBR refresh pulse signals.

Figure 4:
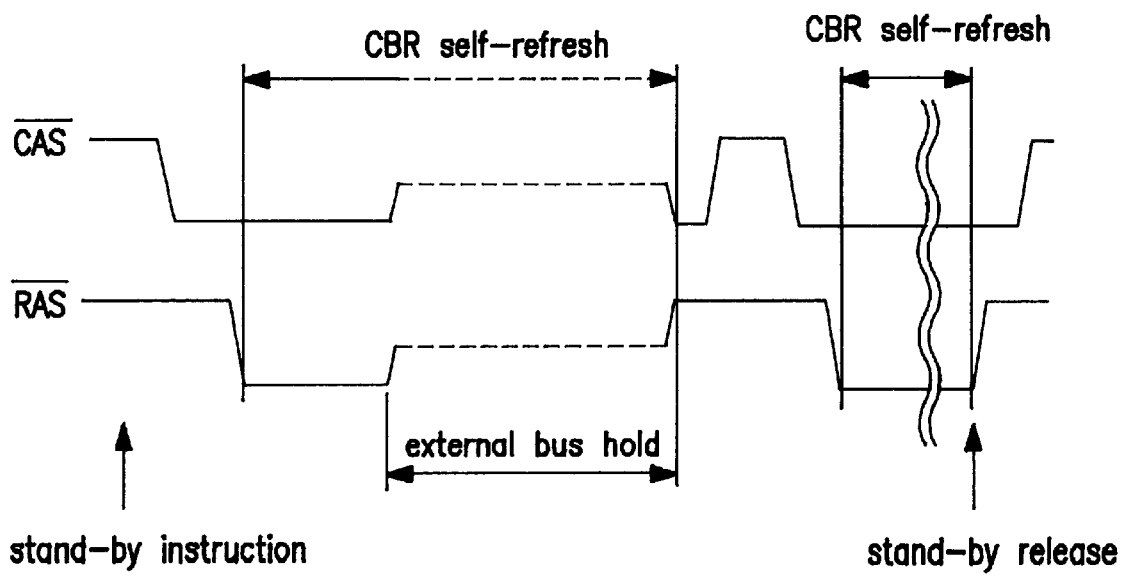
FIG. 4 is timing chart illustrative of variations in voltage of CAS terminals and RAS terminals in the novel CBR-self refresh operations in the first embodiment according to the present invention.

As illustrated in FIG. 4, after the CPU 102 receives a stand-by instruction from an external device, the selector 106 is switched to place the CAS terminal 108 and the RAS terminal 109 under the control of the CBR self-refresh controller 105 so that the DRAM 107 is set in the CBR self-refresh mode. At the same time, the microcomputer 201 enters into the stand-by state.

When the microcomputer 201 remaining in the stand-by state receives an external bus hold demand 110 from an external device, the selector 106 places the CAS terminal 108 and the RAS terminal 109 into the high impedance state to assign a right to control the DRAM 107 to the external device.

After the external bus hold demand 110 disappears, the right to control the DRAM 107 is returned to the microcomputer 201 whereby the selector 106 selects a signal output from the CBR self-refresh controller 105. As a result, the CBR self-refresh stand-by controller 202 controls the CAS terminal 108 and the RAS terminal 109 as illustrated in FIG. 4 to release at once the DRAM 107 from the CBR self-refresh mode and subsequently place the DRAM 107 into the CBR self-refresh mode.

After the microcomputer 201 is released from the stand-by state, the selector 106 selects a dispersion refresh pulse signal output from the dispersion CBR refresh controller 104 and the refresh operation returns to the normal mode.

As described above, even if the microcomputer 201 receives the external bus hold demand 110 under the conditions that the microcomputer 201 is placed in the stand-by state and that the DRAM 107 is in the CBR self-refresh mode, then at the time when the external bus hold is released, the selector 106 in the DRAM controller 203 selects the CBR self-refresh controller 105. Then, the CBR stand-by mode refresh controller 202 controls the CAS terminal 108 and the RAS terminal 109 to release at once the DRAM from the CBR self-refresh mode before place the DRAM into the CBR self-refresh mode again for executing the CBR self-refresh of the DRAM to thereby keep information once stored in the DRAM 107.

The above operations do not need to release the microcomputer 201 from the stand-by state because there is no need to use any software for executing the above processes. This results in a reduction in the power consumption of the microcomputer 201. There is also no need to reduce a capacity of memory for storing the necessary software. Further, there is no need to provide any external circuit for executing the CBR self-refresh of the DRAM 107. This results in a scaling down of total system including the microcomputer 201 and a reduction in manufacturing cost of the total system.

Figure 3:
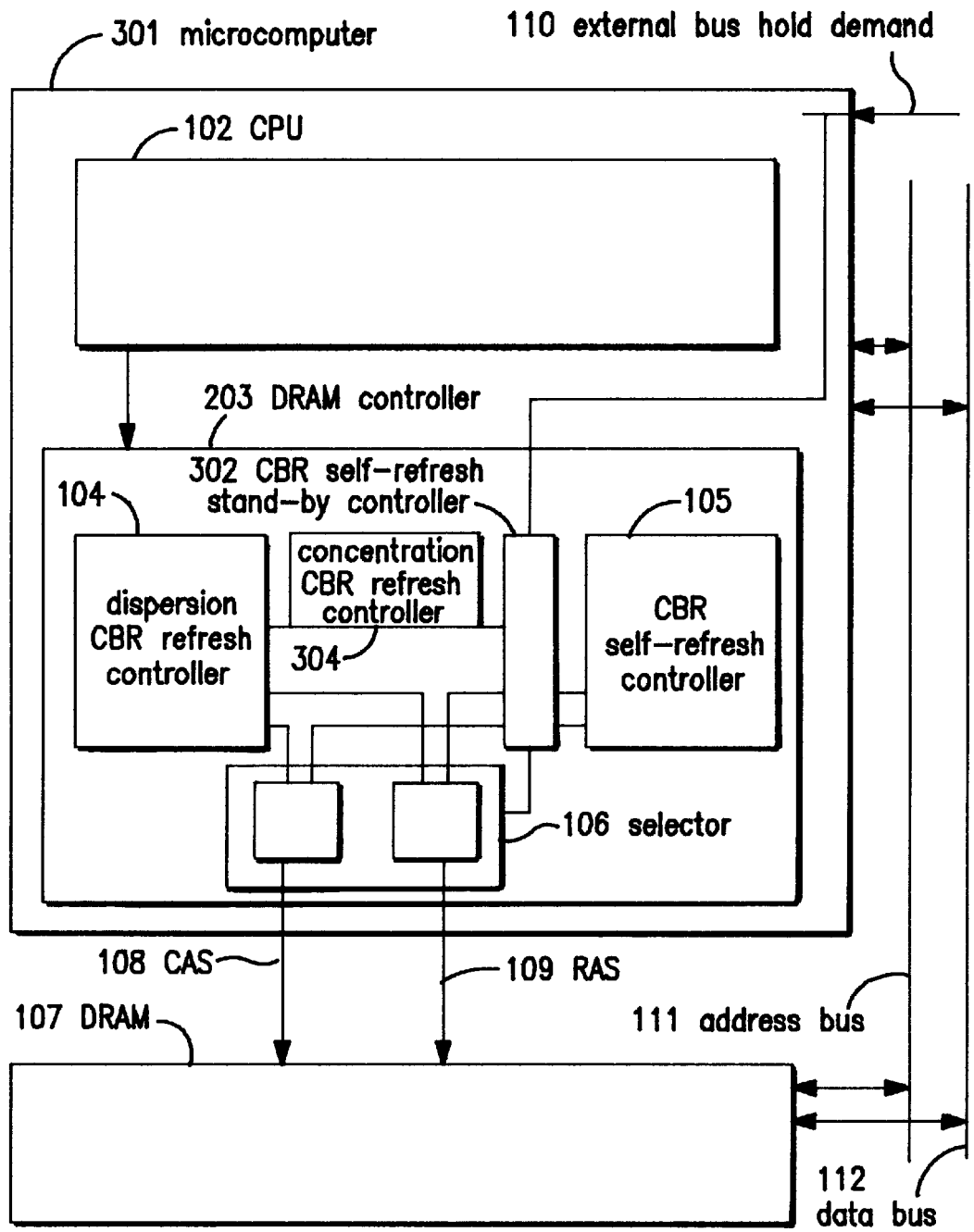
FIG. 3 is a diagram illustrative of a structure of a novel microcomputer accommodating an improved DRAM controller wherein a dispersion CBR refresh is adopted in a second embodiment according to the present invention.

A second embodiment according to the present invention will be described in detail with reference to FIGS. 3 and 5, wherein there is provided another novel microcomputer having a DRAM controller adopting a concentration CBR refresh in a normal mode and further being capable of controlling a DRAM to execute a CBR self-refresh of the DRAM even when an external bus hold demand is generated under a condition that the microcomputer is in a stand-by state.

A microcomputer 301 in the second embodiment according to the present invention includes a CPU 102 and a DRAM controller 303 being electrically connected via a CAS terminal 108 and a RAS terminal 109 to a DRAM 107. The microcomputer 201 is also connected via an address bus 111 and a data bus 112 to the DRAM 107. The DRAM controller 303 is also electrically connected to the CPU 102 for receiving any instruction from the CPU 102.

The DRAM controller 303 includes a dispersion CBR refresh controller 104 for controlling a CBR refresh operation and a CBR self-refresh controller 105 for controlling a CBR self-refresh operation. The DRAM controller 303 further includes a CBR self-refresh stand-by controller 302 which is electrically connected to the CBR self-refresh controller 105 for receiving an external bus hold demand 110. The DRAM controller 303 furthermore includes a selector 106 having a CAS selector and a RAS selector. The CAS selector is electrically connected to the CAS terminal 108 of the DRAM 107. The CAS selector is also electrically connected to the dispersion CBR refresh controller 104. Further, the CAS selector is also electrically connected via the CBR self-refresh stand-by controller 302 to the CBR self-refresh controller 105. The RAS selector is electrically connected to the RAS terminal 109 of the DRAM 107. The RAS selector is also electrically connected to the dispersion CBR refresh controller 104. Further, the RAS selector is also electrically connected via the CBR self-refresh stand-by controller 302 to the CBR self-refresh controller 105. The selector is further connected to the CBR self-refresh stand-by controller 032 for receiving the external bus hold demand. Moreover, the DRAM controller 303 includes a concentration CBR refresh controller 304 provided between the dispersion CBR refresh controller 104 and the CBR self-refresh stand-by controller 302.

The microcomputer 301 uses the concentration CBR refresh method and thus the DRAM controller subjects the DRAM to the concentration CBR refresh in the normal refresh mode. The dispersion CBR refresh controller 104 outputs concentration CBR refresh pulse signals.

Figure 5:
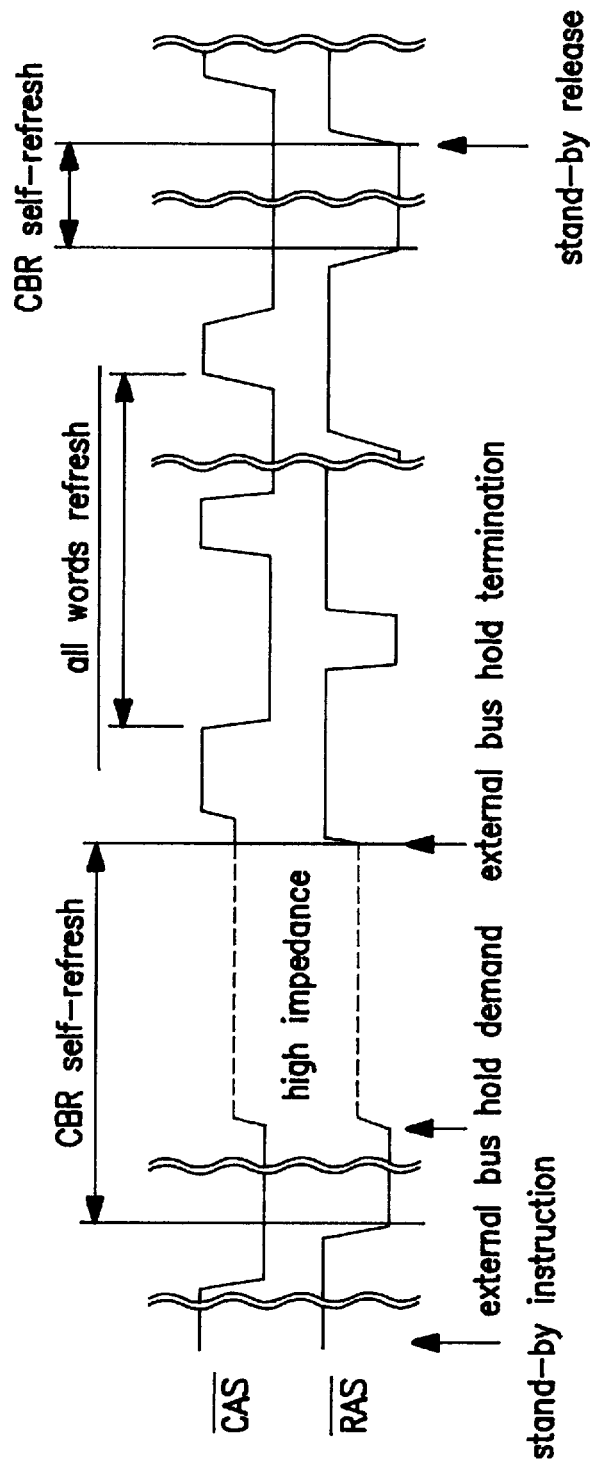
FIG. 5 is a timing chart illustrative of variations in voltage of CAS terminals and RAS terminals in the novel CBR-self refresh operations in the second embodiment according to the present invention.

As illustrated in FIG. 5, after the CPU 102 receives a stand-by instruction from an external device, the CBR self-refresh stand-by controller 302 sends the concentration CBR refresh controller 304 an instruction to execute the concentration CBR refresh. After the concentration CBR refresh controller 304 completes the concentration CBR refresh, the selector 106 is switched to place the CAS terminal 108 and the RAS terminal 109 under the control of the CBR self-refresh controller 105 so that the DRAM 107 is set in the CBR self-refresh mode. At the same time, the microcomputer 301 enters into the stand-by state as illustrated in FIG. 5.

When the microcomputer 301 remaining in the stand-by state receives an external bus hold demand 110 from an external device, the selector 106 places the CAS terminal 108 and the RAS terminal 109 into the high impedance state to assign a right to control the DRAM 107 to the external device.

After the external bus hold demand 110 disappears, the right to control the DRAM 107 is returned to the microcomputer 301 whereby the selector 106 selects a signal output from the CBR self-refresh stand-by controller 302. As a result, the CBR self-refresh stand-by controller 302 controls the CAS terminal 108 and the RAS terminal 109 as illustrated in FIG. 5 to release at once the DRAM 107 from the CBR self-refresh mode and subsequently send the selector 106 an instruction to select the dispersion CBR refresh controller 104 as well as send the dispersion CBR refresh controller 104 an instruction to execute the concentration CBR refresh. As a result, the DRAM 107 enters into the concentration CBR refresh mode. After the concentration CBR refresh is completed, the selector 106 selects an output from the CBR self-refresh controller 105 to place the DRAM 107 into the CBR self-refresh mode again.

After the microcomputer 301 is released from the stand-by state, the CBR self-refresh stand-by controller 302 sends the selector 106 an instruction to select the dispersion CBR refresh controller 104 as well as sends the dispersion CBR refresh controller 104 an instruction to execute the concentration CBR refresh.

As described above, even if the microcomputer 301 receives the external bus hold demand 110 under the conditions that the microcomputer 301 is placed in the stand-by state and that the DRAM 107 is in the CBR self-refresh mode, then at the time when the external bus hold is released, the selector 106 in the DRAM controller 303 selects the CBR self-refresh stand-by controller 302 so that the CBR stand-by mode refresh controller 302 sends the selector 106 an instruction to select the CBR self-refresh stand-by controller 302 so that the CBR self-refresh stand-by controller 302 controls the CAS terminal 108 and the RAS terminal 109 to release at once the DRAM 107 from the CBR self-refresh mode and subsequently send the selector 106 an instruction to select the dispersion CBR refresh controller 104 as well as send the dispersion CBR refresh controller 104 an instruction to execute the concentration CBR refresh. As a result, the DRAM 107 enters into the concentration CBR refresh mode. After the concentration CBR refresh is completed, the selector 106 selects an output from the CBR self-refresh controller 105 to render the DRAM 107 enter into the CBR self-refresh mode again.

After the microcomputer 301 is released from the stand-by state, the CBR self-refresh stand-by controller 302 sends the selector 106 an instruction to select the dispersion CBR refresh controller 104 as well as send the dispersion CBR refresh controller 104 an instruction to execute the concentration CBR refresh to thereby keep information once stored in the DRAM 107.

The above operations do not need to release the microcomputer 301 from the stand-by state because there is no need to use any software for executing the above processes. This results in a reduction in the power consumption of the microcomputer 301. There is also no need to reduce a capacity of memory for storing the necessary software. Further, there is no need to provide any external circuit for executing the CBR self-refresh of the DRAM 107. This results in a scaling down of total system including the microcomputer 301 and a reduction in manufacturing cost of the total system.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A microcomputer comprising:

a CPU; and a DRAM controller being electrically connected to the CPU and also electrically connected to a DRAM for controlling the DRAM to execute dispersion CBR refresh operations in a normal mode, wherein if the microcomputer is in a stand-by state, then the DRAM controller so controls CAS and RAS control terminals of the DRAM as to have the DRAM enter into a CBR self-refresh mode and thereafter if the microcomputer receives an external bus hold demand during the stand-by state, then the DRAM controller places the CAS and RAS control terminals of the DRAM into a high impedance state so that if an external bus hold is released, then the DRAM controller places the CAS and RAS control terminals of the DRAM into an inactive level to release at once the DRAM from the self-refresh mode and subsequently place the DRAM into the self-refresh mode again.

2. The microcomputer as claimed in claim 1, wherein the DRAM controller comprises:

a dispersion CBR refresh controller for controlling a CBR refresh operation;

a CBR self-refresh controller for controlling a CBR self-refresh operation;

a CBR self-refresh stand-by controller electrically connected to the CBR self-refresh controller for receiving an external bus hold demand; and a selector having a CAS selector and a RAS selector, the CAS selector being electrically connected to the CAS terminal of the DRAM and also electrically connected to the dispersion CBR refresh controller as well as electrically connected via the CBR self-refresh stand-by controller to the CBR self-refresh controller, the RAS selector being electrically connected to the RAS terminal of the DRAM and also electrically connected to the dispersion CBR refresh controller as well as electrically connected via the CBR self-refresh stand-by controller to the CBR self-refresh controller, the selector being further connected to the CBR self-refresh stand-by controller for receiving the external bus hold demand.

3. The microcomputer as claimed in claim 2, wherein if the microcomputer receives the external bus hold demand under the conditions that the microcomputer is placed in the stand-by state and that the DRAM is in the CBR self-refresh mode, then at the time when the external bus hold is released, the selector selects the CBR self-refresh controller and then the CBR stand-by mode refresh controller controls the CAS terminal and the RAS terminal to release at once the DRAM from the CBR self-refresh mode before placing the DRAM into the CBR self-refresh mode again.

4. A microcomputer comprising:

a CPU; and a DRAM controller being electrically connected to the CPU, the DRAM controller being also electrically connected to a DRAM for controlling the DRAM to execute concentration CBR refresh operations in a normal mode, wherein if the microcomputer is in a stand-by state, then the DRAM controller so controls CAS and RAS control terminals of the DRAM as to have the DRAM enter into a CBR self-refresh mode and thereafter if the microcomputer receives an external bus hold demand during the stand-by state, then the DRAM controller places the CAS and RAS control terminals into a high impedance state so that if an external bus hold is released, then the DRAM controller places the CAS and RAS control terminals into an inactive level to release at once the DRAM from the self-refresh mode and then execute a concentration CBR refresh of the DRAM before the DRAM controller places the DRAM into the self-refresh mode again.

5. The microcomputer as claimed in claim 4, wherein the DRAM controller comprises:

a dispersion CBR refresh controller for controlling a CBR refresh operation;

a CBR self-refresh controller for controlling a CBR self-refresh operation;

a CBR self-refresh stand-by controller electrically connected to the CBR self-refresh controller for receiving an external bus hold demand;

a selector having a CAS selector and a RAS selector, the CAS selector being electrically connected to the CAS terminal and also electrically connected to the dispersion CBR refresh controller as well as electrically connected via the CBR self-refresh stand-by controller to the CBR self-refresh controller, the RAS selector being electrically connected to the RAS terminal and also electrically connected to the dispersion CBR refresh controller as well as electrically connected via the CBR self-refresh stand-by controller to the CBR self-refresh controller, the selector being further connected to the CBR self-refresh stand-by controller for receiving the external bus hold demand; and a concentration CBR refresh controller provided between the dispersion CBR refresh controller and the CBR self-refresh stand-by controller.

6. The microcomputer as claimed in claim 5, wherein if the microcomputer receives the external bus hold demand under the conditions that the microcomputer is placed in the stand-by state and that the DRAM is in the CBR self-refresh mode, then at the time when the external bus hold is released, the selector in the DRAM controller selects the CBR self-refresh stand-by controller so that the CBR stand-by mode refresh controller sends the selector an instruction to select the CBR self-refresh stand-by controller whereby the CBR self-refresh stand-by controller controls the CAS terminal and the RAS terminal to release at once the DRAM from the CBR self-refresh mode and subsequently send the selector an instruction to select the dispersion CBR refresh controller as well as send the dispersion CBR refresh controller an instruction to execute the concentration CBR refresh so as to have the DRAM enter into the concentration CBR self-refresh mode before the selector selects an output from the CBR self-refresh controller to render the DRAM enter into the CBR self-refresh mode again.

7. A DRAM controller being electrically connected to a DRAM for controlling the DRAM to execute dispersion CBR refresh operations in a normal mode, wherein if the microcomputer is in a stand-by state, then the DRAM controller so controls CAS and RAS control terminals of the DRAM as to have the DRAM enter into a CBR self-refresh mode and thereafter if the microcomputer receives an external bus hold demand during the stand-by state, then the DRAM controller places the CAS and RAS control terminals of the DRAM into a high impedance state so that if an external bus hold is released, then the DRAM controller places the CAS and RAS control terminals of the DRAM into an inactive level to release at once the DRAM from the self-refresh mode and subsequently place the DRAM into the self-refresh mode again.

8. The DRAM controller as claimed in claim 7, wherein the DRAM controller comprises:

a dispersion CBR refresh controller for controlling a CBR refresh operation;

a CBR self-refresh controller for controlling a CBR self-refresh operation;

a CBR self-refresh stand-by controller electrically connected to the CBR self-refresh controller for receiving an external bus hold demand; and a selector having a CAS selector and a RAS selector, the CAS selector being electrically connected to the CAS terminal of the DRAM and also electrically connected to the dispersion CBR refresh controller as well as electrically connected via the CBR self-refresh stand-by controller to the CBR self-refresh controller, the RAS selector being electrically connected to the RAS terminal of the DRAM and also electrically connected to the dispersion CBR refresh controller as well as electrically connected via the CBR self-refresh stand-by controller to the CBR self-refresh controller, the selector being farther connected to the CBR self-refresh stand-by controller for receiving the external bus hold demand.

9. The DRAM controller as claimed in claim 8, wherein if the microcomputer receives the external bus hold demand under the conditions that the microcomputer is placed in the stand-by state and that the DRAM is in the CBR self-refresh mode, then at the time when the external bus hold is released, the selector selects the CBR self-refresh controller and then the CBR stand-by mode refresh controller controls the CAS terminal and the RAS terminal to release at once the DRAM from the CBR self-refresh mode before placing the DRAM into the CBR self-refresh mode again.

10. A DRAM controller being electrically connected to a DRAM for controlling the DRAM to execute concentration CBR refresh operations in a normal mode, wherein if the microcomputer is in a stand-by state, then the DRAM controller so controls CAS and RAS control terminals of the DRAM as to have the DRAM enter into a CBR self-refresh mode and thereafter if the microcomputer receives an external bus hold demand during the stand-by state, then the DRAM controller places the CAS and RAS control terminals into a high impedance state so that if an external bus hold is released, then the DRAM controller places the CAS and RAS control terminals into an inactive level to release at once the DRAM from the self-refresh mode and then execute a concentration CBR refresh of the DRAM before the DRAM controller places the DRAM into the self-refresh mode again.

11. The DRAM controller as claimed in claim 10, wherein the DRAM controller comprises:

a dispersion CBR refresh controller for controlling a CBR refresh operation;

a CBR self-refresh controller for controlling a CBR self-refresh operation;

a CBR self-refresh stand-by controller electrically connected to the CBR self-refresh controller for receiving an external bus hold demand;

a selector having a CAS selector and a RAS selector, the CAS selector being electrically connected to the CAS terminal and also electrically connected to the dispersion CBR refresh controller as well as electrically connected via the CBR self-refresh stand-by controller to the CBR self-refresh controller, the RAS selector being electrically connected to the RAS terminal and also electrically connected to the dispersion CBR refresh controller as well as electrically connected via the CBR self-refresh stand-by controller to the CBR self-refresh controller, the selector being further connected to the CBR self-refresh stand-by controller for receiving the external bus hold demand; and a concentration CBR refresh controller provided between the dispersion CBR refresh controller and the CBR self-refresh stand-by controller.

12. The DRAM controller as claimed in claim 11, wherein if the microcomputer receives the external bus hold demand under the conditions that the microcomputer is placed in the stand-by state and that the DRAM is in the CBR self-refresh mode, then at the time when the external bus hold is released, the selector in the DRAM controller selects the CBR self-refresh stand-by controller so that the CBR stand-by mode refresh controller sends the selector an instruction to select the CBR self-refresh stand-by controller whereby the CBR self-refresh stand-by controller controls the CAS terminal and the RAS terminal to release at once the DRAM from the CBR self-refresh mode and subsequently send the selector an instruction to select the dispersion CBR refresh controller as well as send the dispersion CBR refresh controller an instruction to execute the concentration CBR refresh so as to have the DRAM enter into the concentration CBR self-refresh mode before the selector selects an output from the CBR self-refresh controller to render the DRAM enter into the CBR self-refresh mode again.

* * * * *